(12) United States Patent
Ujii et al.

(10) Patent No.: US 9,590,624 B2
(45) Date of Patent: Mar. 7, 2017

(54) INPUT APPARATUS

(75) Inventors: Junichi Ujii, Kanagawa (JP); Megumi Kuwabara, Kanawaga (JP)

(73) Assignee: KYOCERA Corporation, Kyoto (JP)

( * ) Notice: Subject to any disclaimer, the term of this patent is extended or adjusted under 35 U.S.C. 154(b) by 698 days.

(21) Appl. No.: 13/387,711

(22) PCT Filed: Jul. 28, 2010

(86) PCT No.: PCT/JP2010/004797
§ 371 (c)(1),
(2), (4) Date: Jan. 27, 2012

(87) PCT Pub. No.: WO2011/013368
PCT Pub. Date: Feb. 3, 2011

(65) Prior Publication Data
US 2012/0126962 A1    May 24, 2012

(30) Foreign Application Priority Data

Jul. 29, 2009   (JP) ................................ 2009-176091

(51) Int. Cl.
*G08B 6/00*     (2006.01)
*H03K 17/96*    (2006.01)
(Continued)

(52) U.S. Cl.
CPC ....... *H03K 17/9625* (2013.01); *G06F 3/0414* (2013.01); *G06F 3/0416* (2013.01);
(Continued)

(58) Field of Classification Search
CPC .... G06F 3/0414; G06F 3/0416; G06F 3/0488; H03K 17/9625; H03K 2217/96062; E05Y 2800/00; E05Y 2800/424
(Continued)

(56) References Cited

U.S. PATENT DOCUMENTS 6,024,089 A * 2/2000 Wallace ............ A61M 16/0051
                                                    128/204.21
6,118,435 A    9/2000 Fujita et al.
(Continued)

FOREIGN PATENT DOCUMENTS

JP    10-293644 A    11/1998
JP    2005-196810 A    7/2005
(Continued)

OTHER PUBLICATIONS

International Search Report; PCT/JP2010/004797; Nov. 2, 2010.
(Continued)

*Primary Examiner* — Quang D Pham
(74) *Attorney, Agent, or Firm* — Studebaker & Brackett PC

(57) ABSTRACT

An input apparatus capable of preventing a user's unintentional input by notifying the user of a change in a pressure load is provided.

The input apparatus has a touch face configured to receive a touch operation, a load detection unit configured to detect a pressure load of the touch operation to the touch panel, a vibration unit configured to vibrate the touch face, and a control unit, when the load detection unit detects a pressure load satisfying a standard load to receive an input, configured to perform a control to receive the input by the touch operation. When the load detection unit detects a pressure load satisfying a standard load, lower than the standard load to receive an input, the control unit controls the vibration unit to vibrate.

3 Claims, 11 Drawing Sheets

(51) Int. Cl.
*G06F 3/041* (2006.01)
*G06F 3/0488* (2013.01)

(52) U.S. Cl.
CPC ........ *G06F 3/0488* (2013.01); *E05Y 2800/00* (2013.01); *E05Y 2800/424* (2013.01); *H03K 2217/96062* (2013.01)

(58) Field of Classification Search
USPC ...................................................... 340/407.2
See application file for complete search history.

(56) References Cited

U.S. PATENT DOCUMENTS

| | | | |
|---|---|---|---|
| 6,192,255 B1* | 2/2001 | Lewis et al. .................. 455/558 |
| 7,345,679 B2* | 3/2008 | Katayose ....................... 345/173 |
| 9,086,755 B2* | 7/2015 | Cho et al. |
| 2002/0149561 A1* | 10/2002 | Fukumoto .......... G01C 21/3664 345/156 |
| 2004/0021643 A1 | 2/2004 | Hoshino et al. |
| 2005/0156892 A1* | 7/2005 | Grant ............................ 345/167 |
| 2009/0051667 A1* | 2/2009 | Park et al. ..................... 345/173 |
| 2009/0095541 A1* | 4/2009 | Lee ............................ 178/18.03 |
| 2009/0101416 A1* | 4/2009 | Chuang ....................... 178/18.03 |
| 2009/0128506 A1* | 5/2009 | Nurmi ......................... 345/173 |
| 2010/0017710 A1* | 1/2010 | Kim et al. .................... 715/702 |
| 2010/0099394 A1* | 4/2010 | Hainzl .......................... 455/418 |
| 2010/0127979 A1* | 5/2010 | Lee et al. ..................... 345/158 |
| 2010/0137027 A1* | 6/2010 | Kim ........................... 455/556.1 |
| 2010/0141410 A1* | 6/2010 | Aono ....................... G06F 3/016 340/407.2 |
| 2010/0271312 A1* | 10/2010 | Alameh et al. ............... 345/173 |
| 2010/0289737 A1* | 11/2010 | Iio et al. ..................... 345/156 |
| 2011/0102358 A1* | 5/2011 | Aono ....................... G06F 3/016 345/173 |
| 2011/0105100 A1* | 5/2011 | Tanaka et al. ................ 455/418 |
| 2011/0141047 A1* | 6/2011 | Iwaizumi ............... G06F 3/016 345/173 |
| 2011/0260991 A1* | 10/2011 | Aono ....................... G06F 3/016 345/173 |
| 2011/0279395 A1* | 11/2011 | Kuwabara ............... G06F 3/048 345/173 |
| 2012/0105358 A1* | 5/2012 | Momeyer ............. G06F 3/0414 345/174 |
| 2012/0126962 A1* | 5/2012 | Ujii et al. ................. 340/407.2 |
| 2012/0154134 A1* | 6/2012 | Lim ........................ G06F 3/016 340/407.2 |
| 2012/0154317 A1* | 6/2012 | Aono ....................... G06F 3/016 345/173 |
| 2012/0154330 A1* | 6/2012 | Shimizu ................. G06F 3/016 345/174 |
| 2012/0162114 A1* | 6/2012 | Inoue ....................... G06F 3/016 345/173 |
| 2012/0194460 A1* | 8/2012 | Kuwabara ............... G06F 3/016 345/173 |
| 2013/0286572 A1* | 10/2013 | Tsurusaki ................ G06F 3/041 361/679.01 |
| 2014/0300571 A1* | 10/2014 | Tomizu .................. G06F 3/0416 345/173 |
| 2015/0002416 A1* | 1/2015 | Koike .................... G06F 3/0414 345/173 |
| 2015/0192998 A1* | 7/2015 | Ishimaru ............... G06F 3/0488 345/174 |
| 2015/0234493 A1* | 8/2015 | Parivar ............... G06F 3/04812 345/174 |
| 2015/0241970 A1* | 8/2015 | Park ........................ G06F 3/016 345/173 |
| 2015/0261296 A1* | 9/2015 | Yoshikawa ........... G06F 3/0416 345/173 |
| 2015/0268786 A1* | 9/2015 | Kitada .................. G06F 3/0414 345/173 |
| 2015/0378436 A1* | 12/2015 | Uchikawa ............. G06F 3/0416 345/173 |
| 2016/0179239 A1* | 6/2016 | Marui ....................... G06F 3/043 345/177 |
| 2016/0209957 A1* | 7/2016 | Jung ......................... G06F 3/044 |
| 2016/0239127 A1* | 8/2016 | Kano ..................... G06F 3/0488 |
| 2016/0246336 A1* | 8/2016 | Aono .................... G06F 3/0488 |
| 2016/0246437 A1* | 8/2016 | Hattori ................... G06F 3/0487 |

FOREIGN PATENT DOCUMENTS

| | | |
|---|---|---|
| JP | 2005-332063 A | 12/2005 |
| JP | 2006-039745 A | 2/2006 |
| JP | 2008-016053 A | 1/2008 |

OTHER PUBLICATIONS

"Notification of the First Office Action," issued by the State Intellectual Property Office of China on Jan. 6, 2014, which corresponds to Chinese Patent Application No. 201080033916.7 and is related to U.S. Appl. No. 13/387,711; with English language translation.

* cited by examiner

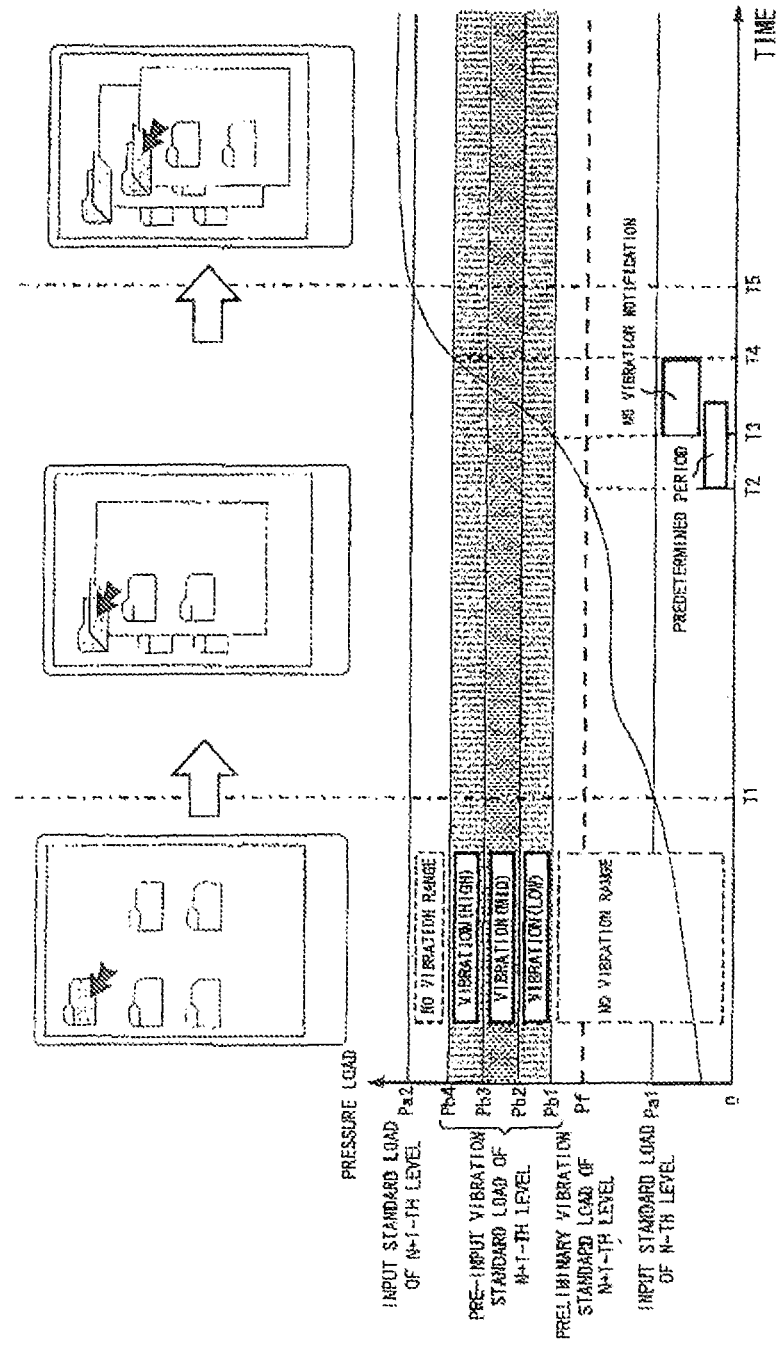

INPUT APPARATUS

CROSS REFERENCE TO RELATED APPLICATION

This application claims priority to and the benefit of Japanese Patent Application No. 2009-176091 filed on Jul. 29, 2009, the entire contents of which are incorporated herein by reference.

TECHNICAL FIELD

The present invention relates to input apparatuses, and more specifically, to input apparatus to receive inputs based on pressure loads.

BACKGROUND ART

For a variety of electronic devices such as, for example, mobile phones and digital cameras, input apparatuses used by users to operate terminals have been developed in a variety of manners according to functions and usages of each electronic device. Many of such input apparatuses have mechanical keys or buttons preliminarily disposed on faces of bodies of the electronic devices, or keys or buttons displayed on a touch panel, so that the users can perform input operations by directly pressing them with fingers or the like.

Generally, one operation (or program) is assigned to one switch of such keys and the like. For the mobile phone, for example, when a pressure input to a numerical keypad is detected, a number corresponding to each key is output. Or, when a pressure input to a menu key is detected, a menu panel is displayed.

However, if the user wishes to perform a plurality of operations continuously and operates keys, each of which is assigned with an individual operation, the user must move the finger back and forth to press desired keys, which may result in troublesome and annoying operations.

In order to deal with such a problem, there is proposed an input apparatus capable of assigning a plurality of operations to pressures applied on the input apparatus for example, see Patent Document 1).

This type of input apparatus allows the user to separately perform a plurality of inputs by adjusting the pressure of one operation to press one key.

As an example of typical usages of such an input apparatus, there is a shutter button of a camera. In using a mobile terminal having a digital camera function, an operator turns on a function to adjust AE (Auto Exposure) and AF (Auto Focus) by performing "halfway pressing", which is a first level input. In that state, by performing "full pressing", which is a second level input, an operation to release the shutter is performed. Since the first level input and the second level input are received when a pressure load on the key satisfies different predetermined loads for each of the levels respectively, it is possible to perform two different operations with one key.

RELATED ART DOCUMENT

Patent Document

Patent Document 1: Japanese Patent Laid-Open No. 2006-039745

SUMMARY OF INVENTION

Technical Problem

In using the apparatus to receive an input based on the pressure load as described above, however, it is necessary for the operator to perform the input operation appropriately adjusting the pressure load applied on the apparatus. Generally, an ability to finely adjust the pressure at fingertip varies greatly between individuals, as some operators are good at it while others are not. Therefore, even if an input operation can be performed without special difficulty by operators with nimble fingers, it is not necessarily true that all general operators can appropriately deal with the input operation requiring fine adjustment of the pressure. Accordingly, it may result in an unintentional input due to misadjustment by the operator.

For example, when the input apparatus set forth above is applied to the shutter button of the camera, even if the operator wishes to maintain a constant pressure on the shutter button while the functions of AE and AF are being operated after reception of the first level input, the pressure may be inadvertently increased due to difficulty in fine adjustment of the pressure at fingertip. In this case, if the pressure increases and the input apparatus receives the second level input, the shutter is released at timing unintended by the operator. Although such an operation is carried out in conformity to a correct procedure, it is an unintended operation and thus nothing but an erroneous operation for the operator.

Accordingly, an object of the present invention in consideration of such a condition is to provide an input apparatus configured to receive the input based on the pressure load, capable of preventing user's unintentional inputs by notifying the operator (user) of a change in the pressure load.

Solution to Problem

In order to solve the above problem, an input apparatus according to a first invention includes: a touch face configured to receive a touch operation; a load detection unit configured to detect a pressure load of the touch operation to the touch face; a vibration unit configured to vibrate the touch face; and a control unit configured to perform a control to receive an input by the touch operation when the load detection unit detects a pressure load satisfying a standard load to receive an input, wherein the control unit controls the vibration unit to vibrate when the load detection unit detects a pressure load satisfying a standard load lower than the standard load to receive an input.

An input apparatus according to a second invention includes: a touch face configured to receive a touch operation; a load detection unit configured to detect a pressure load of the touch operation to the touch face; a vibration unit configured to vibrate the touch face; and a control unit configured to perform a control to receive an input by the touch operation when the load detection unit detects a pressure load changing from a state satisfying a standard load to receive an input to a state failing to satisfy the standard load, wherein the control unit controls the vibration unit to vibrate when the load detection unit detects a pressure load changing from a state satisfying a standard load, higher than the standard load to receive an input, to a state failing to satisfy the standard load.

An input apparatus according to a third invention includes: a touch face configured to receive a touch operation; a load detection unit configured to detect a pressure load of the touch operation to the touch face; a vibration unit configured to vibrate the touch face; and a control unit configured to perform a control to receive an input by the touch operation when the load detection unit detects a pressure load changing from a state failing to satisfy a standard load to receive a first input to a state satisfying the standard load, and when the load detection unit detects a pressure load changing from a state satisfying a standard load to receive a second input, lower than the standard load to receive the first input, to a state failing to satisfy the standard load to receive the second input, wherein the control unit controls the vibration unit to vibrate when the load detection unit detects a pressure load changing from a state failing to satisfy a standard load, lower than the standard load to receive the first input, to a state satisfying the standard load, and when the load detection unit detects a pressure load changing from a state satisfying another standard load, higher than the standard load to receive the second input, to a state failing to satisfy the another standard load.

An input apparatus according to a fourth invention is characterized in that the control unit controls the vibration unit to vibrate in different vibration patterns when the load detection unit detects the pressure load changing from the state failing to satisfy the standard load, lower than the standard load to receive the first input, to a state satisfying the standard load, and when the load detection unit detects the pressure load changing from the state satisfying the another standard load, higher than the standard load to receive the second input, to the state failing to satisfy the another standard load, respectively.

An input apparatus according to a fifth invention is characterized in that the control unit, after a predetermined period following reception of the input by the touch operation, controls the vibration unit to vibrate when the load detection unit detects the pressure load changing from the state failing to satisfy the standard load, lower than the standard load to receive the first input, to the state satisfying the standard load, and when the load detection unit detects the pressure load changing from the state satisfying the another standard load, higher than the standard load to receive the second input, to the state failing to satisfy the another standard load.

An input apparatus according to a sixth invention is characterized in that the control unit, after vibrating the vibration unit, controls magnitude of vibration in accordance with a change in the pressure load detected by the load detection unit.

Effect of the Invention

According to the present invention, the input apparatus to receive the input based on the pressure load can prevent an inadvertent input by the user, by notifying an operator (user) of a change in the pressure load.

BRIEF DESCRIPTION OF DRAWINGS

FIG. 12 is a diagram illustrating an example of the input reception and the vibration notification processing according to the fourth embodiment.

DESCRIPTION OF EMBODIMENTS

Embodiments of the present invention will be described with reference to the accompanying drawings. In the following embodiments, a mobile phone is used as an example of mobile terminals having input apparatuses according to the present invention. However, the mobile terminal to which the input apparatus of the present invention is applicable is not limited to the mobile phone but may include a variety of mobile electronic devices having the input apparatuses, such as PDAs and digital cameras. In addition, the present invention is applicable not only to the mobile terminals but also devices having the input apparatuses, such as ATM machines and ticketing machines of train stations. Moreover, the input apparatus according to the present invention is applicable not only to devices having the touch panels. The present invention is applicable to any input apparatuses having the touch panels or touch switches, such as push-buttons (or keys) to receive operation inputs by operators, and functions capable of detecting pressure loads applied on the touch switches.

First Embodiment

Figure 1:
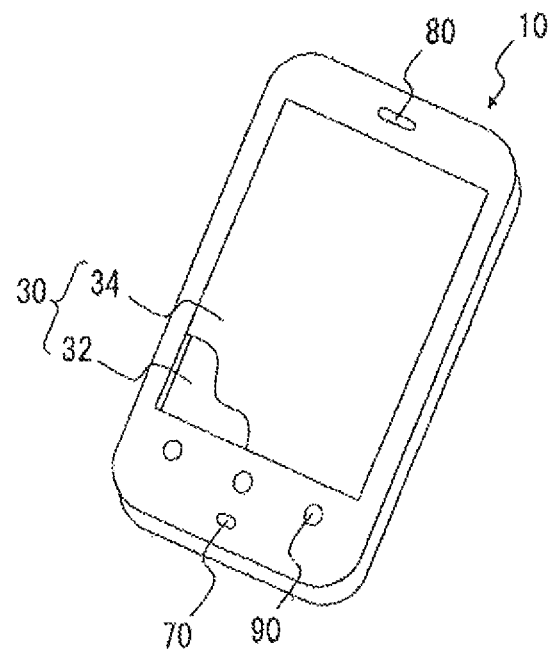
FIG. 1 is an external perspective view of a mobile phone having an input apparatus according to an embodiment of the present invention.

FIG. 1 is an external perspective view illustrating a schematic constitution of a mobile phone 10 having an input apparatus according to a first embodiment of the present invention. As illustrated by a partial cut away on a front face of a terminal body, a mobile phone 10 has a display unit 32 which is constituted of a liquid crystal display (LCD) or an organic EL display. The display unit 32 displays various information and depicted keys and buttons arranged thereon. In addition, a touch face 34, constituted of a matrix switch or the like to allow a touch operation by a user's finger or a stylus pen, is disposed on a front face of the display unit 32. According to the present embodiment, a touch panel 30 is constituted of the display unit 32 and the touch face 34. The mobile phone 10 further includes an audio input unit 70 constituted of a microphone or the like, an audio output unit 80 constituted of a speaker or the like, and a key input unit 90 constituted of at least one mechanical key.

Although the mobile phone 10 may have, in addition, a digital camera function unit, a One-seg broadcast tuner, a Near Field Communication unit such as an infrared communication function unit, a variety of interfaces and the like based on necessary functions, figures and detailed descriptions thereof are omitted.

Figure 2:
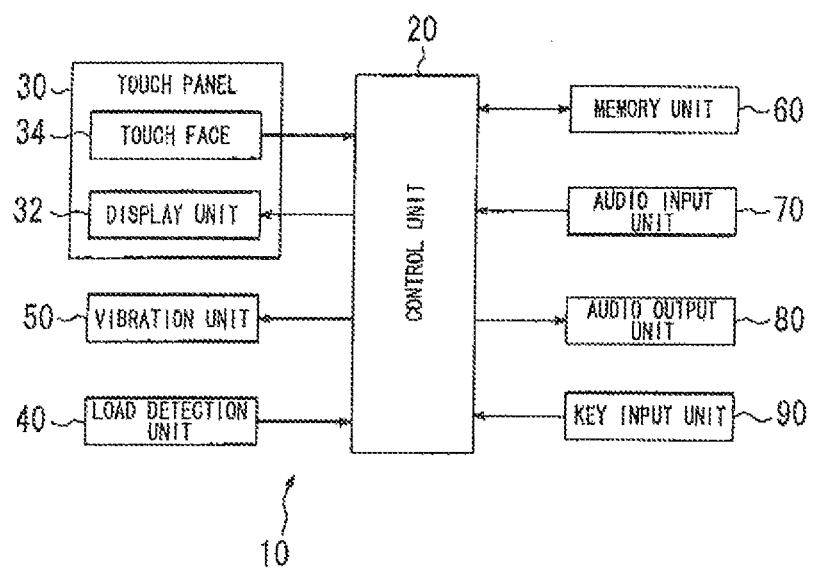
FIG. 2 is a functional block diagram illustrating an internal configuration of the mobile phone according to the embodiment.

FIG. 2 is a functional block diagram illustrating an internal configuration of the mobile phone 10 according to the present embodiment. As illustrated in FIG. 2, the mobile phone 10 has a control unit 20, a touch panel 30, a load detection unit 40, a vibration unit 50, a memory unit 60, an audio input unit 70, an audio input unit 80 and a key input unit 90. The control unit 20 controls and manages entire mobile terminal 10 including each functional block. As described above, the touch panel 30 is constructed by disposing the touch face 34, which receives the touch operation by the user, on the front face of the display unit 32. Thereby, the touch panel 30 receives the touch operations by the user as well as displaying a variety of information such as a result of an input according to each application.

By sensing (detecting) the touch operation by the user's finger or the stylus, the touch face 34 of the touch panel 30 outputs a signal corresponding to a position where an input by the touch operation is detected. The touch panel 30 adopts a known scheme such as, for example, a resistance film scheme, a capacitance scheme or the like. The display unit 32 displays according to each application, as well as displaying a graphical image of a user interface constituted of various keys and buttons to receive an input by a touch operation to the touch face 34 by the user in a predetermined display area. The display unit 32 also displays icons of folders and files, as described below. Hereinafter, the graphical images of various keys and buttons and the icons of folders and files displayed on the display unit 32 to receive the input by the touch operation to the touch face 34 of the touch panel 30 by the user are referred to simply as "objects".

The load detection unit 40 is a strain gauge sensor, for example, and detects a pressure load on the touch panel 30 (or the touch face 34). The vibration unit 50 is a piezoelectric element or an ultrasonic transducer, for example, and vibrates the touch panel 30 (or the touch face 34).

The memory unit 60 stores various applications and a variety of input information, as well as functioning as a work memory. The audio input unit 70 converts user's voice and the like into input signals and transmits them to the control unit 20.

The audio output unit 80 converts voice signals transmitted from the control unit 20 into voice. The key input unit 90 transmits a signal corresponding to an input operation by the user to the control unit 20. Usages and functions of the variety of keys constituting the key input unit 90 are defined according to an application used.

The mobile phone 10 further includes a variety of function units necessary for providing functions as a normal mobile phone, such as an antenna and a radio communication unit allowing for transmission and reception of various information including voice and email with a base station via the internet or a radio communication. However, since these function units have no particular difference from those of known art, descriptions thereof are omitted.

According to the input apparatus of the present embodiment, the control unit 20 monitors the touch operation to the touch face 34 as well as the pressure load detected by the load detection unit 40. The control unit 20 can determine whether the pressure load detected by the load detection unit 40 satisfies predetermined standard loads (standard values).

Here, the "predetermined standard loads" are set as a standard of the pressure load detected by the load detection unit 40 to receive the input by the touch operation to the touch face 34 (hereinafter, referred to as an input standard load) and as a standard of the pressure load to vibrate the vibration unit 50 (hereinafter, referred to as a vibration standard load). These predetermined load standards may be set at an initial setting of the mobile phone 10 or by a setting change by the user. In addition, the load detection unit 40 can detect a pressure load on the touch face 34 changing from a state failing to satisfy the predetermined standard load to a state satisfying it, by monitoring a chronological change of the pressure load. Similarly, the load detection unit 40 can also detect a pressure load on the touch face 34 changing from the state satisfying the standard load to the state failing to satisfy it, by monitoring the chronological change of the pressure load.

In the above description, a value of the standard load is likened to a "threshold of the pressure load" and it is determined that "the standard load is satisfied" when the pressure load reaches the value of the standard load. Although determinations are made based on such a condition in the following description, there may also be other conditions to determine that "the load standard is satisfied". For example, it is possible to determine that "the load standard is satisfied" when the pressure load of the pressure input to the object by the user exceeds the value of the standard load set forth above. In addition, it is also possible to determine that "the load standard is satisfied" when the pressure load at the value of the standard load set forth above is detected by the load detection unit 40.

In addition, the above description is applicable also to conditions to determine that "standard load is not satisfied". That is, in the following description, it is determined that "the standard load is not satisfied" when the pressure load becomes less than the value of the standard load. However, it is also possible to determine that "the load standard is not satisfied" when, for example, the pressure load of the pressure input to the object by the user becomes equal to or less than the value of the standard load set forth above. In addition, it is also possible to determine that "the load standard is not satisfied" when the pressure load at the value of the standard load set forth above becomes no longer detected by the load detection unit 40.

Next, setting of the standard load and detection of the pressure load on the touch face 34 of the touch panel 30 of the mobile phone 10 according to the present embodiment will be described.

According to the mobile phone 10 of the present embodiment, the touch operation is performed to the touch face 34 of the touch panel 30 by the user's finger or the stylus. When the touch operation is performed to the touch face 34 in this manner, the load detection unit 40 detects the pressure load on the touch face 34.

Figure 3:
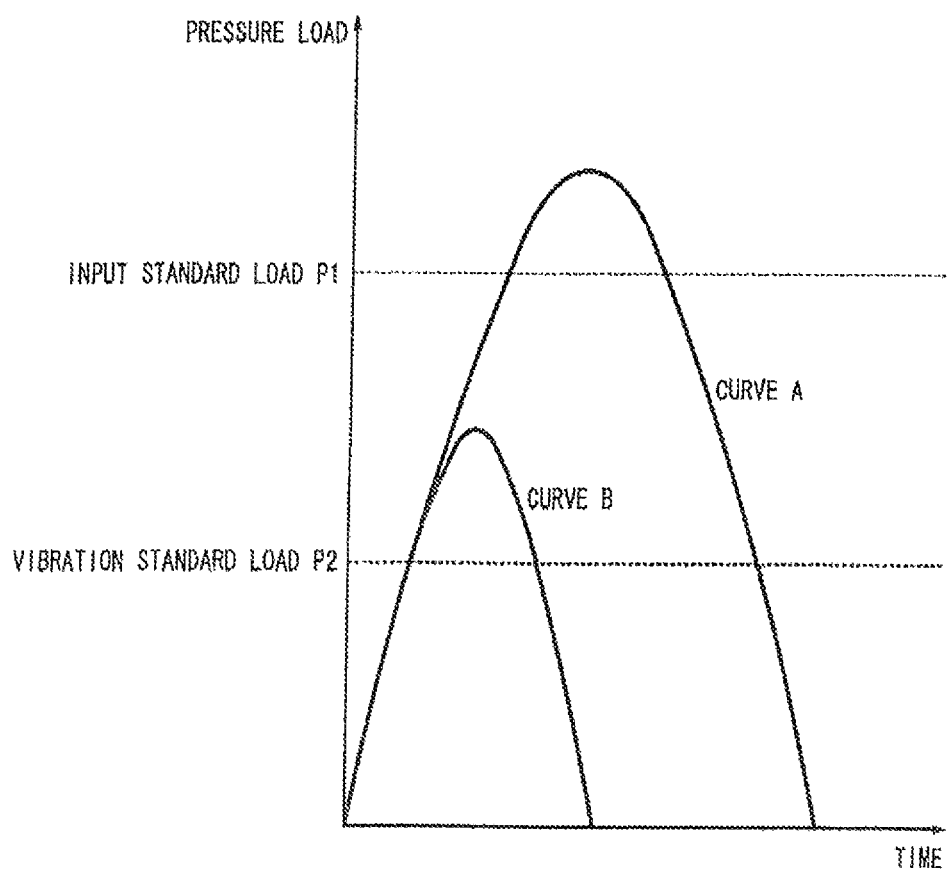
FIG. 3 is a graph schematically illustrating a standard load and a chronological change of a pressure load detected by a load detection unit when a user performs a touch operation to a touch panel.

FIG. 3 is a diagram illustrating the pressure load of the touch operation to the touch face 34 by the user's finger or the stylus detected by the load detection unit 40. FIG. 3 schematically illustrates an example of the chronological change of the pressure load detected by the load detection unit 40 when the user performs an input by pressing the touch face 34 of the touch panel 30. In operation pressing the touch face 34 of the touch panel 30, the user usually increases the pressure on the touch face 34 after touching it until determining that the input is received (that is, the user acts to press the touch face 34 down). Then, after determining that the input is received, the user reduces the pressure on the touch face 34 (that is, the user acts to move the finger or the like away from the touch face 34). As illustrated by a curve A in FIG. 3, therefore, the pressure load detected by the load detection unit 40 is first increased in an upward curve with time and then reduced in a downward curve.

As such, when the user inputs to the touch face 34 by the touch operation, the pressure load draws a curve as illustrated by the curve A. Hence, by setting an input standard load P1 as illustrated in FIG. 3, it is possible to prevent reception of an operation by mere touch to the touch face 34.

In addition, by setting a standard load P2 lower than the input load standard P1 as the vibration standard load, the control unit 20 controls the vibration unit 50 so that the touch face 34 is vibrated when the load detection unit 40 detects a pressure load satisfying the vibration standard load P2 (a pressure load changing from a state failing to satisfy the vibration standard load P2 to a state satisfying it).

Accordingly, if the user inadvertently applies pressure on the touch face 34 without intending to perform an input, the touch face 34 is vibrated when the load detection unit 40 detects a pressure load satisfying the vibration standard load P2 (a pressure load changing from the state failing to satisfy the vibration standard load P2 to the state satisfying it). Thereby, it is possible to notify the user of increase in the pressure load. When feeling vibration of the touch face 34, the user recognizes that a pressure is inadvertently applied and thus reduces the pressure to prevent an unintentional input. In this case, the pressure load draws a curve B as illustrated in FIG. 3. Since the load detection unit 40 does not detect a pressure load satisfying the input standard load P1, an unintentional input by the user is not received.

Next, input reception and vibration notification processing according to the present embodiment will be described.

The first embodiment describes a case that, in order to carry out the input reception and the vibration notification processing, the input standard load and the vibration standard load to notify a pressure load lower than the input standard load by vibration are set.

Figure 4:
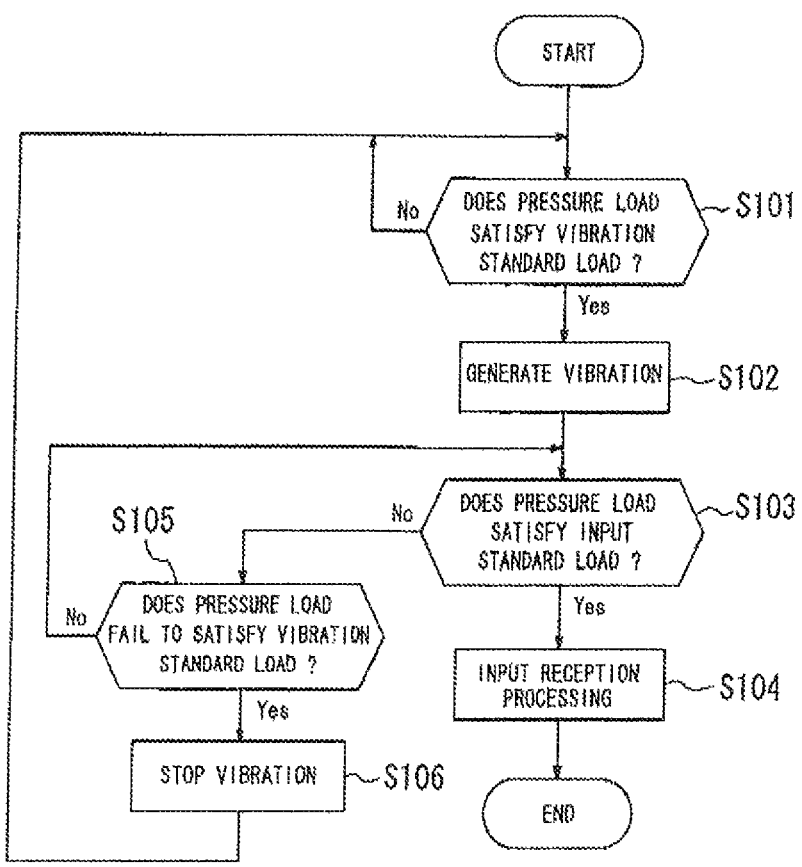
FIG. 4 is a flowchart illustrating an input reception and a vibration notification processing according to a first embodiment.

FIG. 4 is a flowchart illustrating the input reception and the vibration notification processing according to the first embodiment. This operation starts when the touch operation is performed to the touch face 34 of the touch panel 30. It is assumed that an object of a folder to receive an input is displayed on the display unit 32 at a position where the touch operation is performed.

When an input by the touch operation to the touch face 34 is detected, the control unit 20 determines whether the load detection unit 40 has detected the pressure load satisfying the vibration standard load (step S101). If the load detection unit 40 detects the pressure load satisfying the vibration standard load at step S101, the control unit 20 controls the vibration unit 50 such that the touch face 34 is vibrated (step S102). The vibration of the touch face 34 notifies the user that the pressure load satisfies the vibration standard load, and reminds the user that the input will be received when the pressure load is increased.

After step S102, the control unit 20 determines whether the load detection unit 40 has detected a pressure load satisfying the input standard load (step S103).

Then, at step S103, if the pressure load on the touch face 34 satisfying the input standard load is detected, the control unit 20 receives the input by the touch operation. Here, since the object of the folder is displayed on the display unit 32 at a position where the touch operation is performed, an input operation corresponding to the folder is carried out (step S104). That is the control unit 20 newly displays an object of a file and/or folder, included in a layer immediately below the folder displayed, on the display unit 32.

If the input by the touch operation is received at step S104, the present operation ends. On the other hand, if the pressure load on the touch face 34 satisfying the input standard load is not detected at step S103, the operation shifts to step S105. At step S105, the control unit 20 determines whether the load detection unit 40 has detected a pressure load failing to satisfy the vibration standard load. If the pressure load failing to satisfy the vibration standard load is detected at step S105, the control unit 20 controls to stop vibration of the vibration unit 50 (step S106) and then returns to step S101.

Figure 5:
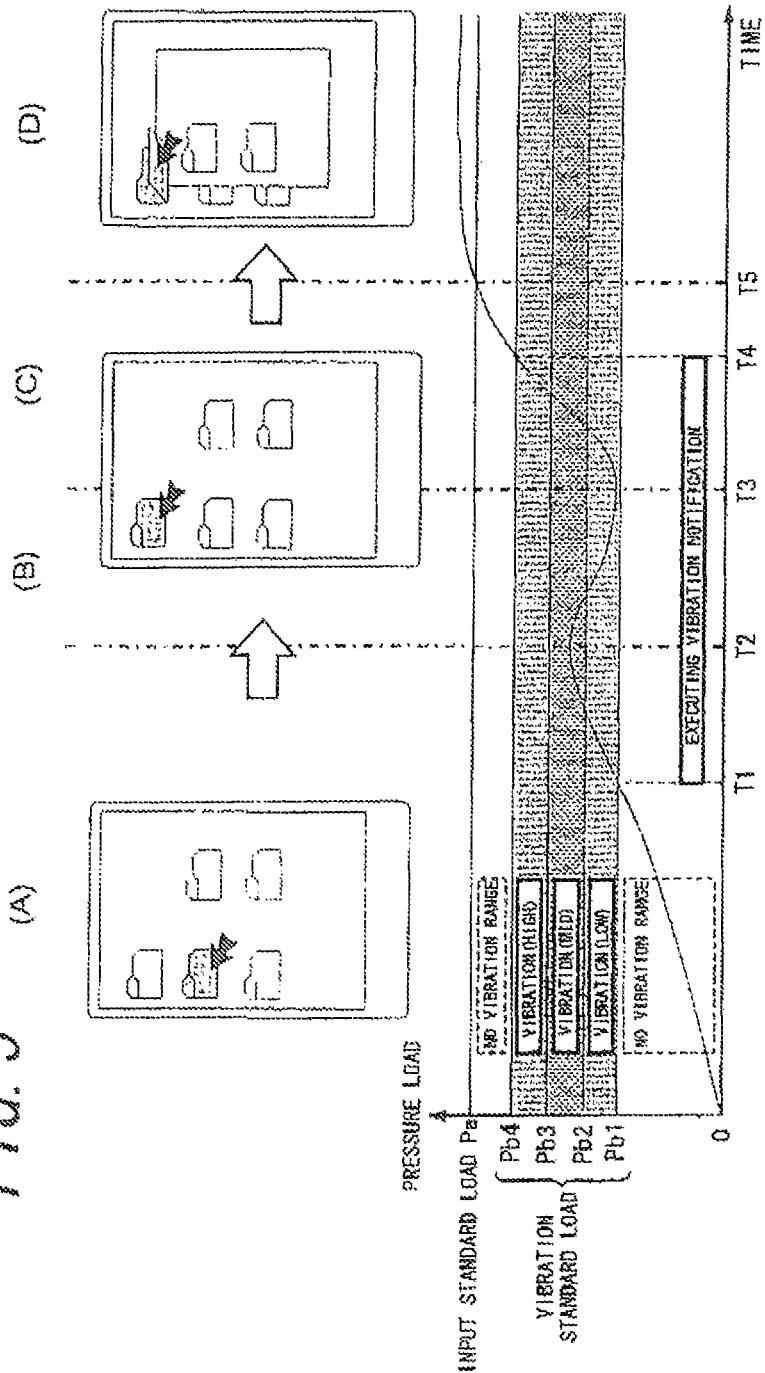
FIG. 5 is a diagram illustrating an example of the input reception and the vibration notification processing according to the first embodiment.

FIG. 5 is a diagram specifically illustrating the input reception and the vibration notification processing according to the first embodiment. In FIG. 5, the chronological change of the pressure load on the touch face 34 of the touch panel 30 detected by the load detection unit 40 in the operation described above is illustrated in a lower half of the figure and a change of a display of the display unit 32 in accordance to the chronological change is illustrated in an upper half. In FIG. 5, the standard loads described in the processing set forth above are illustrated in such a manner that Pa denotes the input standard load, whereas Pb1, Pb2, Pb3 and Pb4 denote the vibration standard loads.

As illustrated in FIG. 5, a plurality of vibration standard loads are provided. As a higher vibration standard load is satisfied by a pressure load detected by the load detection unit 40, the control unit 20 controls the vibration unit 50 to increase vibration amplitude to vibrate the touch face 34. That is, after vibrating the vibration unit 50, the control unit 20 controls magnitude of vibration in accordance with a change in the pressure load detected by the load detection unit 40.

As described above, the touch face 34 is vibrated with greater amplitude as the pressure load becomes closer to the input standard load Pa. Thereby, it is possible to clearly notify the user that the pressure load of the touch operation is approaching the input standard load Pa. In addition, since the vibration amplitude becomes greater as the pressure load becomes closer to the input standard load Pa, it is possible for the user to know, with magnitude of the vibration amplitude, how close the pressure load on the touch face 34 is to the input standard load Pa.

FIG. 5(A) illustrates a state that, due to inadvertent contact to the touch face 34 of the touch panel 30 by the user's finger or the like, a pressure is unintentionally applied on the touch face 34 and the pressure load detected by the load detection unit 40 is gradually increased.

Here, there may be another reason that a pressure is applied without an intention of the user as described above. If there is an operation activated by a mere touch to the touch face 34 (operation to display a property or a summary of a folder in response to a mere contact to the touch face 34 at a position where the folder is displayed on the display unit 32), the pressure load may be unintentionally increased due to misadjustment of the pressure load by the user when the user is touching the touch face 34 to maintain activation of the operation.

In FIG. 5(A), a hatched object of the folder is illustrated, that corresponds to a position on the touch face 34 where an input is detected. As described above, if there is an object of a folder or a file on the touch panel 34 at a position where the input is detected, it is preferable that the control unit 20 colors the object or the like, in order to notify the user that the input to the object is detected. In FIG. 5(A), arrows at the hatched folders indicate that an input by the user's fingertip or the like is detected at their positions. It is possible to set either to display or to hide such an object indicating an input position on the display unit 32.

FIG. 5(A) illustrates a state that a user's fingertip inadvertently touches the touch face 34 at a position where a middle left folder is displayed on the display unit 32, and the pressure is increased unintentionally. When the pressure load detected by the load detection unit 40 satisfies the vibration standard load Pb1 while this folder is being pressed, the control unit 20 controls the vibration unit 50 such that the touch face 34 is vibrated with small amplitude. Then, when the pressure load detected by the load detection unit 40 is further increased and satisfies the vibration standard load Pb2, the control unit 20 increases amplitude to vibrate the touch face 34 such that the user is notified of increase in the pressure with more clear vibration.

With increase of vibration of the touch face 34, the user recognizes that the pressure is applied at an unintentional position on the touch face 34. As illustrated in FIG. 5(B), accordingly, the user intentionally reduces the pressure on the touch face 34 and slides the finger or the like to the folder, to which the user wishes to perform an input operation.

FIG. 5(C) illustrates that the user then increases the pressure to the folder, to which the user wishes to perform the input operation. In a state illustrated in FIG. 5(C), since the user is intentionally increasing the pressure, the user keeps the pressure even though the load detection unit 40 detects a pressure satisfying the vibration standard load Pb2 and the control unit 20 wildly vibrates the touch face 34. Then, when the load detection unit 40 detects a pressure load satisfying the input standard load Pa, the control unit 20 receives the input by the touch operation by the user and opens a top left folder (state D). When the load detection unit 40 detects a pressure load satisfying the vibration standard load Pb4, the control unit 20 stops vibration of the vibration unit 50. This is because, when the pressure load satisfies the input standard load Pa and the input is received, an operation to notify the user that the input is received is performed by vibrating the touch face 34. Accordingly, since the control unit 20 vibrates the touch face 34 simultaneously with reception of the input after stopping vibration, the user can clearly recognize that the input is received.

According to the present embodiment, as described above, the input standard load and the vibration standard load lower than the input standard load are set. It is also set such that the pressure load on the touch face 34 of the touch panel 30 satisfies the vibration standard load before satisfying the input standard load. Therefore, the touch face 34 is vibrated before the control unit 20 receives the input by the touch operation. Since the user is notified by vibration before the input is received, it is possible to call user's attention before reception of an unintentional input due to misadjustment of the pressure by the user.

Second Embodiment

Next, the input reception and the vibration notification processing according to a second embodiment of the present invention will be described.

According to the second embodiment, using the first embodiment set forth above, a plurality of input standard loads (standard loads to receive a first input) are set. When the load detection unit 40 detects a pressure load changing from a state failing to satisfy one of those input standard loads to a state satisfying it, or a pressure load changing from the state satisfying one of those input standard loath to the state failing to satisfy it, the control unit 20 controls to receive the input by the touch operation associated with the pressure load.

Figure 6:
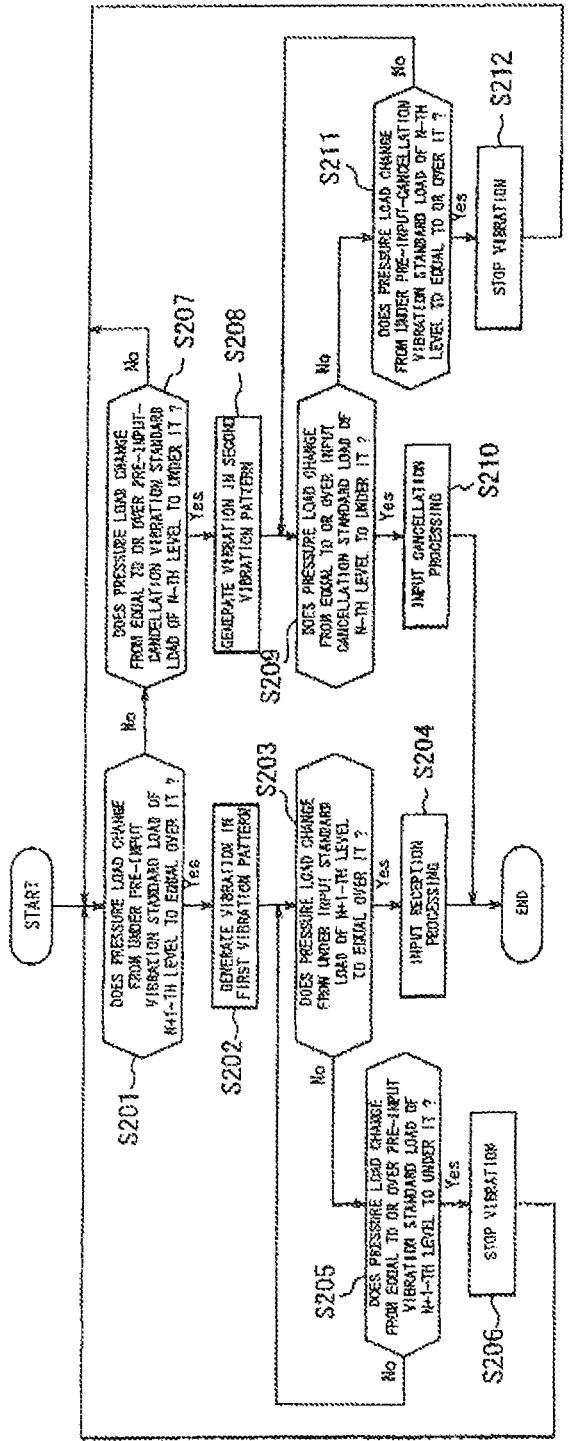
FIG. 6 is a flowchart illustrating the input reception and the vibration notification processing according to a second embodiment.

FIG. 6 is a flowchart of the input reception and the vibration notification processing according to the second embodiment. This operation starts at a point when, in response to a touch operation to the touch face 34 of the touch panel 30, the load detection unit 40 detects a pressure load changing from a state failing to satisfy an input standard load of an N-th level to a state satisfying it. The input standard load of the N-level is an input standard load of an N−1th level higher than an input standard load of a first level, provided that the input standard load of the first level is the lowest among the plurality of input standard loads and an input standard load of a second level is one level higher than the input standard load of the first level.

After reception of an input with the pressure load satisfying the input standard load of the N-th level, a standard load (input cancellation standard load (standard load to receive a second input)) for cancellation of an input is set, which is lower than the input standard load of the N-th level (standard load to receive the first input). When the load detection unit 40 detects a pressure load changing from a state satisfying the input cancellation standard load to a state failing to satisfy it, the control unit 20 receives an input to cancel the input of the N-th level and a reception state of the input of the N-th level is canceled. Such cancellation of the reception state of the input is carried out by, for example, an operation to close a folder opened or an operation to end an application activated.

In addition, a standard load for vibration notification (pre-input vibration standard load associated with the N+1 level), which is lower than the input standard load of the N+1-th level and higher than the input standard load of the N-th level, and a standard load for vibration notification (pre-input-cancellation vibration standard load associated with the N-th level), which is lower than the input standard load of the N-th level and higher than the input cancellation standard load of the N-th level, are set. When the load detection unit 40 detects a pressure load changing from a state failing to satisfy the pre-input vibration standard load associated with the N+1-th level to a state satisfying it, or a pressure load changing from a state satisfying the pre-input-cancellation vibration standard load associated with the N-th level to a state failing to satisfy it, the control unit 20 controls the vibration unit 50 such that the touch face 34 is vibrated.

In addition, it is assumed that the object of the folder to receive an input is displayed on the display unit 32 at a position where the touch operation is performed. It is to be noted that the same descriptions as those of the first embodiment are omitted.

After the load detection unit 40 detects a pressure load changing from a state failing to satisfy the input standard load of the N-th level to a state satisfying it and the control unit 20 receives the input by the touch operation with such a pressure load, the control unit 20 determines whether the load detection unit 40 has detected a pressure load changing from a state failing to satisfy the pre-input vibration standard load associated with the N+1-th level to a state satisfying it (step S201).

Subsequently, at step S201, if the load detection unit 40 detects a pressure load changing from the state failing to satisfy the pre-input vibration standard load associated with the N+1-th level to the state satisfying it, the control unit 20 controls the vibration unit 50 such that the touch face 34 is vibrated in a first vibration pattern (step S202). Here, the first vibration pattern is different from a second vibration pattern described below, and used by the vibration unit 50 to vibrate the touch face 34 when the load detection unit 40 detects a pressure load changing from the state failing to satisfy the pre-input vibration standard load to the state satisfying it. Accordingly, when the touch face 34 is vibrated in the first vibration pattern, the user can recognize that the load detection unit 40 has detected a pressure load changing from the state failing to satisfy the pre-input vibration standard load to the state satisfying it, that is, that the pressure load on the touch face 34 is increased in comparison to the input standard load of the N-th level.

Then, the control unit 20 determines whether the load detection unit 40 has detected a pressure load changing from the state failing to satisfy the input standard load associated with the N+1-th level to the state satisfying it (step S203). If a pressure load changing from the state failing to satisfy the input standard load associated with the N+1-th level to the state satisfying it is detected at step S203, the control unit 20 receives the input by the touch operation with such a pressure load (step S204). Here, since the object of the folder is displayed on the display unit 32 at a position where the touch operation is performed, an input operation to the folder is carried out. That is, the control unit 20 newly displays an object of a file and/or folder, included in a layer immediately below the folder displayed, on the display unit 32. After the input by the touch operation is received at step S204, the present operation ends. On the other hand, if a pressure load changing from the state failing to satisfy the input standard load associated with the N+1-th level to the state satisfying it is not detected at step S203, the control unit 20 determines whether the load detection unit 40 has detected a pressure load changing from the state satisfying the pre-input vibration standard load associated with the N+1-th level to the state failing to satisfy it (step S205). If the load detection unit 40 detects a pressure load changing from the state satisfying the pre-input vibration standard load associated with the N+1-th level to the state failing to satisfy it at step S205, the control unit 20 stops vibration of the vibration unit 50 (step S206) and returns to step S201.

Figure 7:
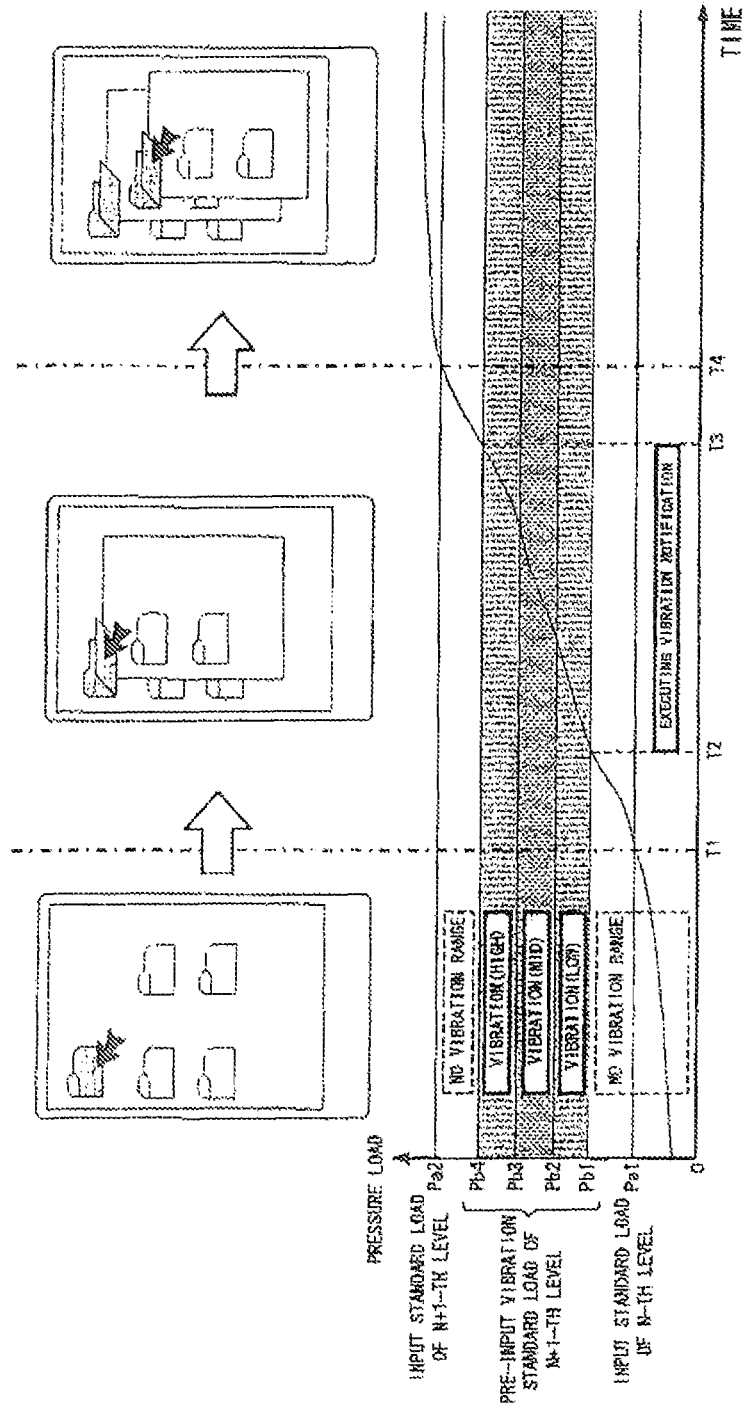
FIG. 7 is a diagram illustrating an example of the input reception and the vibration notification processing according to the second embodiment, when the pressure load is increased.

FIG. 7 is a diagram illustrating an example of the input reception and the vibration notification processing according to the second embodiment, when the pressure load is increased. In FIG. 7, the chronological change of the pressure load on the touch face 34 of the touch panel 30 detected by the load detection unit 40 in the operation described above is illustrated in a lower half of the figure and a change of the display of the display unit 32 in accordance to the chronological change is illustrated in an upper half. In FIG. 7, Pa1 and Pa2 denote the input standard load of the N-th level and the input standard load of the N+1-th level, respectively, which are described in the operation stated above. In addition, Pb1, Pb2, Pb3 and Pb4 denote the pre-input vibration standard loads associated with the N+1-th level.

At a time T1, when the load detection unit 40 detects a pressure load changing from the state failing to satisfy the input standard load of the N-th level to the state satisfying it, the control unit 20 receives the input by the touch operation with such a pressure load and carries out the input operation to the folder at the position where the touch operation is performed. At a time T2, when the load detection unit 40 detects a pressure load changing from the state failing to satisfy the pre-input vibration standard load Pb1 associated with the N+1-th level to the state satisfying it, the control unit 20 controls the vibration unit 50 such that the touch face 34 is vibrated.

Here, the touch face 34 is vibrated in the first vibration pattern. The first vibration pattern is different from the second vibration pattern described below. When the load detection unit 40 detects a pressure load changing from the state failing to satisfy the pre-input vibration standard load Pb1 to the state satisfying it, that is, when the pressure load is being increased, the control unit 20 controls the vibration unit 50 such that the touch face is vibrated in the first vibration pattern. Accordingly, when the touch face is vibrated in the first vibration pattern, the user can recognize that the user is increasing the pressure of the touch operation.

Between the times T2 and T3, when the load detection unit 40 detects a pressure load changing from a state failing to satisfy a pre-input vibration notification standard Pb2 associated with the N+1-th level to a state satisfying it, the control unit 20 increases the vibration amplitude of the touch face 34. In addition, when the load detection unit 40 detects a pressure load changing from the state satisfying the pre-input vibration standard lead Pb2 associated with the N+1-th level to the state failing to satisfy it, the control unit 20 reduces the vibration amplitude of the touch face 34. Here, for a vibration notification standard Pb3 associated with the N+1-th level also, the control unit 20 carries out the same operation as that for a vibration notification standard Pb2 associated with the N+1-th level.

At the time T3, in addition, when the load detection unit 40 detects a pressure load changing from a state failing to satisfy the standard load Pb4 to a state satisfying it, the control unit stops vibration of the vibration unit 50. Then, at a time T4, when the load detection unit 40 detects a pressure load changing from the state failing to satisfy the input standard load of the N+1-th level to the state satisfying it, the control unit 20 receives the input by the touch operation with such a pressure load. In this example, that is, the control unit 20 opens the folder at the position where the touch operation is performed.

Next, referring back to a flow illustrated in FIG. 6, an operation carried out when the pressure load detected by the load detection unit 40 is reduced after start of the flow will be described. At step S201 in FIG. 6, if the load detection unit 40 does not detect a pressure load changing from the state failing to satisfy the pre-input vibration standard load associated with the N+1-th level to the state satisfying it, the control unit 20 determines whether the load detection unit 40 has detected a pressure load changing from the state satisfying the pre-input-cancellation vibration standard load associated with the N-th level to the state failing to satisfy it (step S207). If the load detection unit 40 detects a pressure load changing from the state satisfying the pre-input-cancellation vibration standard load associated with the N-th level to the state failing to satisfy it, the control unit 20 controls the vibration unit 50 such that the touch face 34 is vibrated in the second vibration pattern (step S208). Here, the second vibration patter is different from the first vibration pattern at step S202 and used by the vibration unit 50 to vibrate the touch face 34 when the load detection unit 40 detects a pressure load changing from the state satisfying the pre-input-cancellation vibration standard load to the state failing to satisfy it. Accordingly, when the touch face 34 is vibrated in the second vibration pattern, the user can recognize that the load detection unit 40 has detected a pressure load changing from the state satisfying the pre-input-cancellation vibration standard load to the state failing to satisfy it, that is, that the pressure load on the touch face 34 is reduced in comparison to the input standard load of the N-th level.

After step S208, the control unit 20 determines whether the load detection unit 40 has detected a pressure load changing from a state satisfying the input cancellation standard load associated with the N-th level to the state failing to satisfy it (step S209). At step S209, if the load detection unit 40 detects a pressure load changing from the state satisfying the input cancellation standard load associated with the N-th level to the state failing to satisfy it, the control unit 20 receives the input by the touch operation with such a pressure load. Then, the control unit 20 cancels an input state received when the pressure load changing from the state failing to satisfy the input standard load associated with the N-th level to the state satisfying it is detected. Such cancellation of the input state is carried out by, for example, the operation to close a folder which has been opened or the operation to end an application which has been activated. After the control unit 20 receives the input at step S210, the present operation ends.

On the other hand, at step S209, if a pressure load changing from the state satisfying the input cancellation standard load associated with the N-th level to the state failing to satisfy it is not detected, the control unit 20 determines whether the load detection unit 40 has detected a pressure load changing from the state failing to satisfy the pre-input-cancellation vibration standard load associated with the N-th level to the state satisfying it (step S211). When the load detection unit 40 detects a pressure load changing from the state failing to satisfy the pre-input-cancellation vibration standard load associated with the N-th level to the state satisfying it, the control unit 20 stops vibration of the vibration unit 50 (step S212) and returns to step S201. On the other hand, if the load detection unit 40 does not detect a pressure load changing from the state failing to satisfy the pre-input-cancellation vibration standard load associated with the N-th level to the state satisfying it, the operation returns to step S209.

Figure 8:
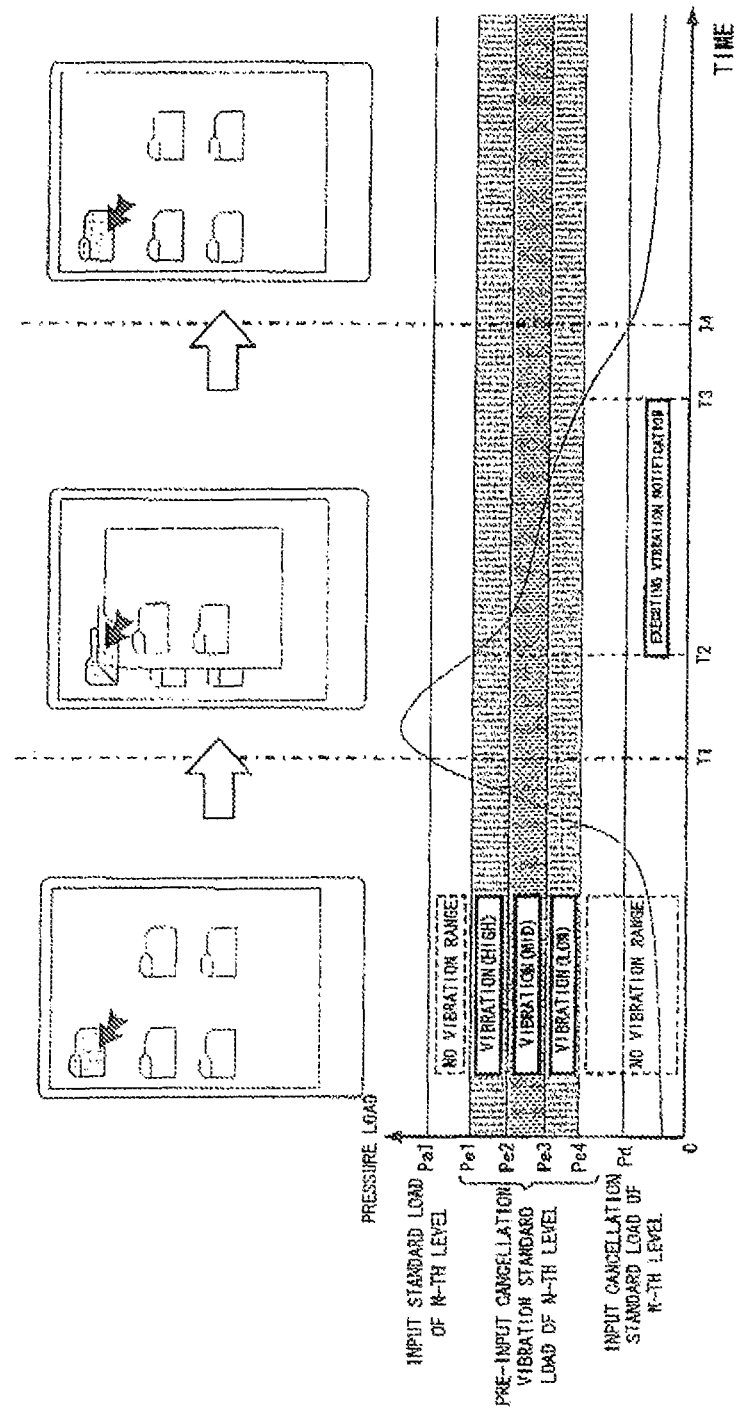
FIG. 8 is a diagram illustrating an example of the input reception and the vibration notification processing according to the second embodiment, when the pressure load is reduced.

FIG. 8 is a diagram illustrating an example of the input reception and the vibration notification processing according to the present embodiment, when the pressure load is reduced. In FIG. 8, the chronological change of the pressure load on the touch face 34 of the touch panel 30 detected by the load detection unit 40 in the operation described above is illustrated in a lower half of the figure and a change of the display of the display unit 32 in accordance with the chronological change is illustrated in an upper half. In FIG. 8, Pa1 and Pd denote the input standard load of the N-th level described in the operation set forth above and the input cancellation standard load of the N-th level, respectively. Also, Pe1, Pe2, Pe3 and Pe4 denote the pre-input-cancellation vibration standard loads associated with the N-th level.

At the time T1, when the load detection unit 40 detects a pressure load changing from the state failing to satisfy the input standard load of the N-th level to the state satisfying it, the control unit 20 receives the input by the touch operation with such a pressure load and carries out the input operation to the folder at the position where the touch operation is performed. Then, at the time T2, when the load detection unit 40 detects a pressure load changing from a state satisfying the pre-input-cancellation notification vibration standard load Pe1 associated with the N-th level to a state failing to satisfy it, the control unit 20 controls the vibration unit 50 such that the touch face 34 is vibrated. Here, the touch face 34 is vibrated in the second vibration pattern. The second vibration pattern is different from the first vibration pattern set forth above.

Between the times T2 and T3, when the load detection unit 40 detects a pressure load changing from a state satisfying the pre-input-cancellation vibration notification standard Pe2 associated with the N-th level to a state failing to satisfy it, the control unit 20 further increases the vibration amplitude of the touch face 34. When the load detection unit 40 detects a pressure load changing from a state failing to satisfy the vibration notification standard Pe2 to a state satisfying it, the control unit 20 further reduces the vibration amplitude of the touch face 34. Here, for the vibration notification standard Pe3 associated with the N-th level also, the control unit 20 carries out the same operation as that for the vibration notification standard Pe2 associated with the N-th level described above.

At the time T3, if the load detection unit 40 detects a pressure load changing from a state satisfying the standard load Pe4 to a state failing to satisfy it, the control unit 20 stops vibration of the vibration unit 50. Then, at the time T4, when the load detection unit 40 detects a pressure changing from a state satisfying the input cancellation standard load Pd to a state failing to satisfy it, the control unit 20 receives the input by the touch operation with such a pressure load. Then, the control unit 20 cancels the input state received when a pressure load changing from a state failing to satisfy the input standard load Pa1 associated with the N-th level to a state satisfying it is detected. Here, such cancellation of the input state is carried out by closing the folder opened at the time T1.

According to the present embodiment, as described above, if an input is received when a pressure load changing from a state satisfying the input standard load (input cancellation standard) set to be lower than the pressure load to a state failing to satisfy it is detected while a pressure load is being detected, the vibration standard load (pre-input-cancellation vibration standard load) higher than the input standard load is set. Therefore, before detecting a pressure load changing from the state satisfying the input standard load to the state failing to satisfy it, the load detection unit 40 detects a pressure load changing from the state satisfying the vibration standard load to the state failing to satisfy it. Accordingly, the touch face 34 is vibrated before the input by the touch operation is received. Since the user is notified by vibration before the input is received, it is possible to call user's attention before an unintentional input due to misadjustment of the pressure by the user is received.

According to the present embodiment, in addition, under a condition that an input is received as the pressure load is changed by a predetermined amount, either by increasing or decreasing, the user is provided with vibration when the pressure load of the touch operation by the user changes. Thereby, the user is notified of that the pressure load is approaching the input standard load. In addition, since the vibration patterns to be provided when the pressure load is increased and when the pressure load is reduced are different from each other, it is enabled that the user adjusts the pressure load by increasing or reducing it, based on a type of the vibration provided.

Third Embodiment

Next, the input reception and the vibration notification processing according to a third embodiment of the present invention will be described.

According to the third embodiment, using the second embodiment described above, different operations are carried out in accordance with whether a predetermined period following reception of an input by the control unit 20 has expired.

Figure 9:
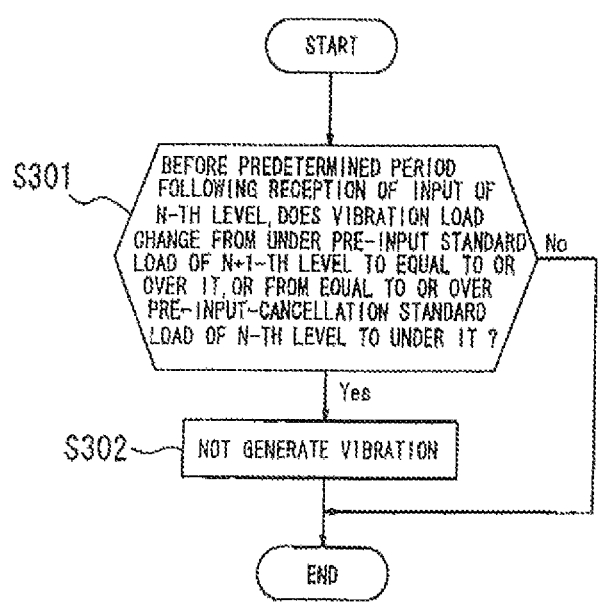
FIG. 9 is a flowchart illustrating the input reception and the vibration notification processing according to a third embodiment.

FIG. 9 is a flowchart of the input reception and the vibration notification processing according to the third embodiment. This operation starts at a point when, in response to a touch operation to the touch face 34 of the touch panel 30, the load detection unit 40 detects a pressure load changing from a state failing to satisfy the input standard load of the N-level to a state satisfying it and the control unit 20 receives the input by the touch operation with such a pressure load.

Before a predetermined period following reception of an input by the control unit expires, the control unit 20 determines whether the load detection unit 40 has detected a pressure load changing from the state failing to satisfy the pre-input vibration standard load of the N+1-th level to the state satisfying it, or a pressure load changing from the state satisfying the pre-input-cancellation vibration standard load of the N-th level to the state failing to satisfy it (step S301). At step S301, before the predetermined period expires, if the load detection unit 40 detects a pressure load changing from the state failing to satisfy the vibration notification standard load to the state satisfying it, or a pressure load changing from the state satisfying the vibration notification standard load of the N-th level to the state failing to satisfy it, the control unit 20 does not vibrate the vibration unit 50, even if the load detection unit 40 detects these pressure loads (step S302). Then, before the predetermined period following end of the present operation, if the load detection unit 40 detects a pressure load changing from the state failing to satisfy the pre-input vibration standard load of the N+1th level to the state satisfying it, the control unit 20 shifts to step S203 in FIG. 6. If the load detection unit 40 detects a pressure load changing from the state satisfying the pre-input-cancellation vibration notification standard load of the N-th level to the state failing to satisfy it, the control unit 20 shifts to step S209 in FIG. 6.

Meanwhile, at step S301, if the predetermined period expires before the load detection unit 40 detects a pressure load changing from the state failing to satisfy the pre-input vibration standard load of the N+1-th level to the state satisfying it, or a pressure load changing from the state satisfying the pre-input-cancellation vibration standard load of the N-th level to the state failing to satisfy it, the present operation ends and the control unit 20 shifts to step S201 in FIG. 6.

Figure 10:
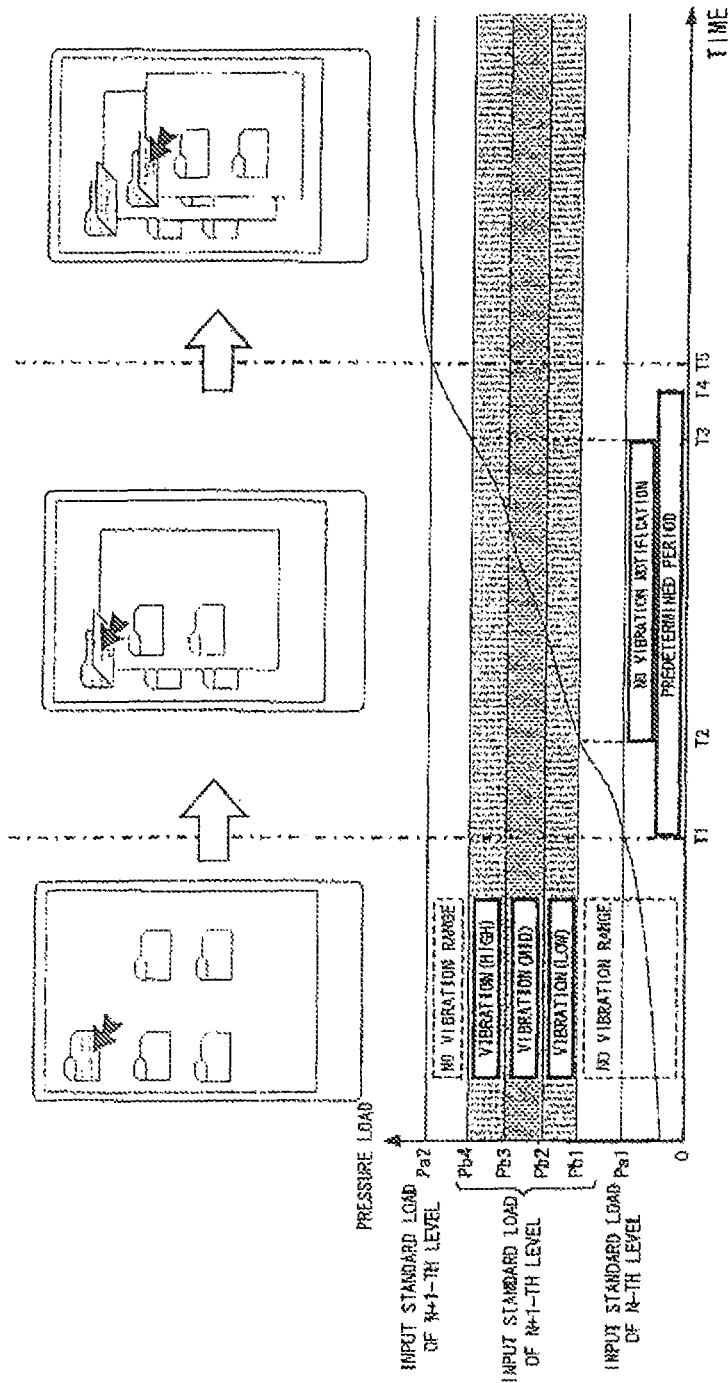
FIG. 10 is a diagram illustrating an example of the input reception and the vibration notification processing according to the third embodiment.

FIG. 10 is a diagram illustrating an example of the input reception and the vibration notification processing according to the present embodiment described above, when the pressure load is increased. In FIG. 10, the chronological change of the pressure load on the touch face 34 of the touch panel 30 detected by the load detection unit 40 in the operation described above is illustrated in a lower half of the figure and a change of the display of the display unit 32 in accordance to the chronological change is illustrated in an upper half. In FIG. 10, Pa1 and Pa2 denote the input standard load of the N-th level described in the operation set forth above and the pre-input standard load of the N+1-th level, respectively. Also, Pb1, Pb2, Pb3 and Pb4 denote the pre-input vibration standard loads associated with the N+1-th level. In addition, a period (predetermined period) not to vibrate the vibration unit 50 after the input unit 20 receives an input is set. It is to be noted that the same description as those in the second embodiment are omitted.

At time the time T1, when the load detection unit 40 detects a pressure load changing from the state failing to satisfy the input standard load of the N-th level to the state satisfying it, the control unit 20 receives the input by the touch operation with such a pressure load, opens the folder at the position where the touch operation is performed, and then displays the folder on the display unit 32.

Then, at the time T2, even if the load detection unit 40 detects a pressure load changing from the state failing to satisfy the pre-input vibration standard load of the N+1-th level to the state satisfying it, the control unit 20 does not control to vibrate the vibration unit 50, as the time T2 is a period (predetermined period) not to vibrate the vibration unit 50. Similarly, before the time T4 at which the predetermined period expires, even if the load detection unit 40 detects a pressure load changing from the state failing to satisfy the pre-input vibration standard load of the N+1-th level to the state satisfying it, or a pressure load changing from the state satisfying it to the state failing to satisfy it, the control unit 20 does not control to vibrate the vibration unit 50.

At a time T5, after the time T4 at which the predetermined period expires, if the load detection unit 40 detects a pressure load changing from the state failing to satisfy the input standard load of the N+1-th level to the state satisfying it, the control unit 20 receives the input by the touch operation with such a pressure load and opens the folder at the position where the touch operation is performed, and display it on the display unit 32.

According to the present embodiment, as described above, if the predetermined period following reception of an input by the control unit 20 does not expire, the control unit 20 does not control the vibration unit 50 to vibrate the touch face 34, even if the load detection unit 40 detects a pressure load failing to satisfy the standard load to notify vibration to the state satisfying it. Accordingly, when the user continuously performs operations of an input of the N-th level and an input of the N+1-th level in a short period (when the user wishes to perform the input of the N-th level and the input of the N+1-th level at once), the touch face 34 vibrates only at timing receiving the inputs. Therefore, the user does not have a feeling of strangeness because of vibration in operation.

Fourth Embodiment

Next, the input reception and the vibration notification processing according to a fourth embodiment of the present invention will be described.

According to the fourth embodiment, using the above embodiments, when the user instantly increases the pressure, the vibration notification before reception of an input is not provided.

Figure 11:
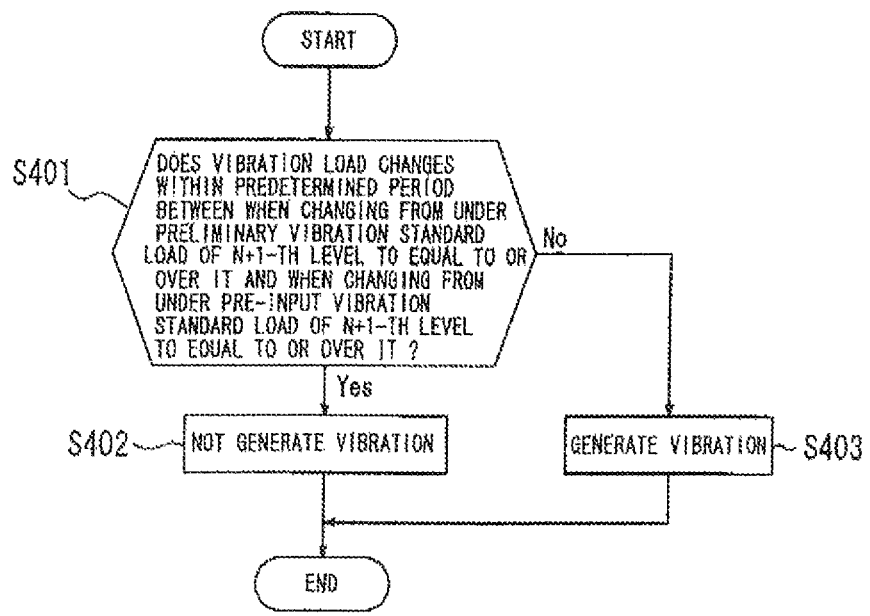
FIG. 11 is a flowchart illustrating the input reception and the vibration notification processing according to a fourth embodiment.

FIG. 11 is a flowchart of the input reception and the vibration notification processing according to the fourth embodiment. According to the present embodiment, in addition to the standard load set in the second embodiment described above, a preliminary vibration standard load is newly set. The preliminary vibration standard load of the N+1-th level is set between the pre-input vibration standard load of the N+1-th level and the input standard load of the N-th level. The control unit 20 determines whether to vibrate the vibration unit 50, based on a time between when the load detection unit 40 detects a pressure load changing from a state failing to satisfy the preliminary vibration standard load of the N+1-th level to a state satisfying it and when the load detection unit 40 detects a pressure load changing from the state failing to satisfy the pre-input vibration standard load of the N+1-th level to a state satisfying it.

The present operation starts at a point when, in response to the touch operation to the touch face 34 of the touch panel 30, the load detection unit 40 detects a pressure load changing from the state failing to satisfy the input standard load of the N-th level to the state satisfying it and the control unit 20 receives the input by the touch operation with such a pressure load.

At step S401, the control unit 20 determines whether a period between when the load detection unit 40 detects a pressure load changing from the state failing to satisfy the preliminary vibration standard load of the N+1-th level to the state satisfying it and when the load detection unit 40 detects a pressure load changing from the state failing to satisfy the pre-input vibration standard load of the N+1-th level to the state satisfying it is within a predetermined period. This predetermined period may be either different from or the same as that of the third embodiment.

At step S401, if the period between when the load detection unit 40 detects a pressure load changing from the state failing to satisfy the preliminary vibration standard load of the N+1-th level to the state satisfying it and when the load detection unit 40 detects a pressure load changing from the state failing to satisfy the pre-input vibration standard load of the N+1-th level to the state satisfying it is within the predetermined period, the control unit 20 ends the present operation without vibrating the vibration unit 50 (step S402). After the end of the present operation, the control unit 20 shifts to step S203 in FIG. 6.

On the other hand, if the period between when the load detection unit 40 detects a pressure load changing from the state failing to satisfy the preliminary vibration standard load of the N+1-th level to the state satisfying it and when the load detection unit 40 detects a pressure load changing from the state failing to satisfy the pre-input vibration standard load of the N+1-th level to the state satisfying it exceeds the predetermined period, the control unit 20 vibrates the vibration unit 50 such that the touch face 34 is vibrated (step S403) and then ends the present operation. The control unit 20 shifts to step S203 in FIG. 6 after the end of the present operation.

FIG. 12 is a diagram illustrating an example of the input reception and the vibration notification processing according to the present embodiment set forth above. In FIG. 12, the chronological change of the pressure load on the touch face 34 of the touch panel 30 detected by the load detection unit 40 in the operation described above is illustrated in a lower half of the figure and a change of a display of the display unit 32 in accordance to the chronological change is illustrated in an upper half. In FIG. 12, Pa1 and Pa2 denote the input standard load of the N-th level and the input standard load of the N+1-th level, respectively, which are described in the operation stated above. Also, Pb1, Pb2, Pb3 and Pb4 denote the vibration notification standard loads associated with the N+1-th level. In addition, Pf denotes the preliminary vibration standard load of the N+1-th level described above.

At the time T1, when the load detection unit 40 detects a pressure load changing from the state failing to satisfy the input standard load of the N-th level to the state satisfying it, the control unit 20 receives the input by the touch operation with such a pressure load, opens the folder at the position where the touch operation is performed, and then displays the folder on the display unit 32.

Then, at the time T2, even if the load detection unit 40 detects a pressure load changing from the state failing to satisfy the preliminary vibration standard load of the N+1-th level to the state satisfying it and, at the time T3, which is within the predetermined period after the detection, detects a pressure had changing from the state failing to satisfy the pre-input vibration standard load of the N+1-th level to the state satisfying it, the control unit 20 does not vibrate the vibration unit 50.

Then, at a time T5, when the load detection unit 40 detects a pressure load changing from the state failing to satisfy the input standard load of the N+1-th level to the state satisfying it, the control unit 20 receives the input by the touch operation with such a pressure load, opens the folder at the position where the touch operation is performed, and then displays the folder on the display unit 32.

According to the present embodiment, as described above, if the period between when the load detection unit 40 detects a pressure load changing from the state failing to satisfy the preliminary vibration standard load of the N+1-th level to the state satisfying it and when the load detection unit 40 detects a pressure load changing from the state failing to satisfy the pre-input vibration standard load of the N+1-th level to the state satisfying it is within the predetermined period, the control unit 20 does not vibrate the vibration unit 50, even if the load detection unit 40 detects a pressure load changing from the state failing to satisfy the pre-input vibration standard load of the N+1-th level to the state satisfying it. Accordingly, the touch face 34 is not vibrated when the user intentionally performs an input by increasing the pressure instantly. Therefore, the user does not have the feeling of strangeness because of vibration in operation.

Although the present invention is described based on the figures and the embodiments, it is to be understood that those skilled in the art may easily vary or alter in a multiple manner based on disclosure of the present invention. Accordingly, such variation and modification are included in a scope of the present invention.

In the above embodiments, the vibration unit 50 is vibrated when the pressure load is changed, in order to notify the user of a change in the pressure load. However, it is also possible to notify the user of a change in the pressure load by, for example, generating a sound, changing a display of the display unit, or changing color or a shape of the object, when the pressure load is changed.

In addition, vibration is generated before an input is received in the above embodiments. However, it is also possible to provide vibration before, for example, the pressure load detected by the load detection unit 40 becomes 0 (before the user's finger or the like becomes out of contact to the touch face).

REFERENCE SIGNS LIST

10 mobile phone
20 control unit
30 touch panel
32 display unit
34 touch face
40 load detection unit
50 vibration unit
60 memory unit
70 audio input unit
80 audio output unit
90 key input unit

The invention claimed is:

1. An input apparatus for preventing a user's unintentional input by notifying the user of a change in a pressure load, the input apparatus comprising:

a touch face configured to receive a touch operation by the user;

a load detection unit configured to detect the pressure load of the touch operation on the touch face;

a vibration unit configured to vibrate the touch face; and a control unit configured to perform a control to receive an input, corresponding to an application, by the touch operation when the load detection unit detects the pressure load of the touch operation satisfying an input standard load to receive the input according to said application, wherein the control unit controls the vibration unit to vibrate when the load detection unit detects the pressure load satisfying a vibration standard load, which is lower than the input standard load to call the user's attention before a reception of the unintentional input due to misadjustment of the pressure load by the user, and the control unit controls the vibration unit to stop vibrating when the load detection unit detects the pressure load changing from a state failing to satisfy an another standard load to a state satisfying the another standard load and the load detection unit detects the pressure load between the another standard load and the input standard load, the another standard load being lower than the input standard load and higher than the vibration standard load.

2. The input apparatus according to claim 1, wherein the control unit controls magnitude of vibration in accordance with a change in the pressure load lower than the input standard load to receive the input when the load detection unit detects the pressure load between the vibration standard load and the another standard load.

3. The input apparatus according to claim 1, wherein the control unit controls the vibration unit not to vibrate when the load detection unit detects the pressure load lower than the vibration standard load.

* * * * *